United States Patent [19]
Haartsen

[11] Patent Number: 6,081,697
[45] Date of Patent: Jun. 27, 2000

[54] MULTI-CARRIER RADIO SYSTEM AND RADIO TRANSCEIVER IMPLEMENTATION

[75] Inventor: Jacobus Cornelis Haartsen, Staffanstorp, Sweden

[73] Assignee: Telefonaktiebolaget LM Ericsson, Stockholm, Sweden

[21] Appl. No.: 08/821,443

[22] Filed: Mar. 21, 1997

[51] Int. Cl.[7] ............................. H04B 1/68; H03C 3/00
[52] U.S. Cl. .................... 455/109; 455/46; 455/103; 455/303; 455/324; 455/202; 332/167; 329/356; 375/301; 375/321
[58] Field of Search ....................... 455/118, 112, 455/180.1, 188.1, 552, 553, 303, 304, 313, 314, 323, 324, 202, 46, 47, 103, 203; 375/322, 329, 334, 302, 303, 308, 301; 332/103, 167, 170; 329/304, 306, 356–357

[56] References Cited

U.S. PATENT DOCUMENTS

| | | |
|---|---|---|
| 4,220,818 | 9/1980 | Kahn . |
| 4,241,451 | 12/1980 | Maixner et al. . |
| 4,577,157 | 3/1986 | Reed . |
| 4,710,814 | 12/1987 | Gassmann et al. ............... 455/202 |
| 4,803,700 | 2/1989 | Dewey ............................. 329/357 |
| 5,020,147 | 5/1991 | Okanobu ........................... 455/302 |
| 5,469,112 | 11/1995 | Lee . |
| 5,638,401 | 6/1997 | Jones ................................ 332/103 |

FOREIGN PATENT DOCUMENTS

| | | |
|---|---|---|
| 715 403 | 6/1996 | European Pat. Off. . |
| 2 055 025 | 2/1981 | United Kingdom . |

OTHER PUBLICATIONS

Michiel Steyaert et al., "Analog Integrated Polyphase Filters," R.J. van de Plassche et al. (eds), Kluwer Academic Publishers, pp. 149–166, 1995.

*Primary Examiner*—Nguyen Vo
*Attorney, Agent, or Firm*—Burns, Doane, Swecker & Mathis, L.L.P.

[57] ABSTRACT

A multi-carrier radio system in which pairs of subcarriers are positioned in frequency such that each subcarrier in a pair is the image of the other subcarrier in the pair. By making each subcarrier the image of another subcarrier, the radio system of the present invention permits highly integrated low-IF transceiver implementation. In an exemplary embodiment, a multi-carrier transceiver includes an integrated receiver comprising a first mixer for mixing an input signal with a local oscillator signal to produce an in-phase downconverted signal. Additionally, a first phase shifter phase-shifts the local oscillator signal to produce a quadrature local oscillator signal, and a second mixer mixes the input signal with the quadrature local oscillator signal to produce a quadrature downconverted signal. Thereafter, a second phase shifter phase-shifts, or rotates, the quadrature downconverted signal to produce a rotated quadrature downconverted signal. A summer sums the in-phase downconverted signal and the rotated quadrature downconverted signal to produce an upper band detection output signal, and a subtractor subtracts the rotated quadrature downconverted signal from the in-phase downconverted signal to produce a lower band detection output signal. The exemplary multi-carrier transceiver also includes a compatible integrated transmitter for generating appropriate multi-carrier signals.

9 Claims, 11 Drawing Sheets

MULTI-CARRIER RADIO SYSTEM AND RADIO TRANSCEIVER IMPLEMENTATION

BACKGROUND

The present invention relates to radio communications systems and, more particularly, to low-cost mobile transceivers deployed in such systems.

During the past decade, there has been an enormous rise in the deployment of mobile telephony. After a relatively slow start with respect to radio systems based on analog technology, interest in mobile phones has escalated as digital technology has become available. Today, large parts of the world are covered by mobile networks which are available for commercial usage. Although analog systems such as AMPS, NMT and ETACS are still in operation and have been installed widely, most new subscribers adopt the newer digital systems such as GSM, D-AMPS, and PDC.

Since the mobile terminal has become a consumer product, there has been a constant drive toward cost-effective implementation. The general trend is to integrate as many functions as possible on a single integrated circuit (IC) or chip in order to reduce the number of external components required. Doing so not only reduces costs, but also reduces power consumption and increases reliability. Therefore, there is a constant search for radio architectures that allow this integration, and the ultimate goal is to produce a single-chip radio. In other words, a single integrated circuit on which all transceiver functions are provided.

A major obstacle with respect to on-chip implementation involves signal filtering. In particular, rigid requirements are placed on channel filters in order to suppress adjacent channel signals and in-band blocking signals. Most mobile receivers today use a superheterodyne-type structure in which the RF signal is subsequently down-converted and filtered in one or more IF stages. However, the required high-Q bandpass filters must have high selectivity and are difficult to integrate. Usually, off-chip filters like ceramic or crystal filters or Surface-Acoustic-Wave (SAW) filters are used for this purpose.

Another architecture which is typically more appropriate for on-chip integration is the homodyne receiver. Here, the down-conversion takes place directly to baseband or DC, in which case low-pass filters can be applied for selectivity which are easier to implement on chip. However, the homodyne receiver has problems as well. For example, there is typically DC off-set and second-order modulation which falls at DC and which cannot easily be distinguished from the information signal.

A third known radio architecture is the low-IF structure. In this architecture, the RF signal is down-converted to a low intermediate frequency which allows the usage of filters with a low Q. Such filters are easier to implement on chip. However, a problem associated with low-IF receivers relates to image signals. Multiplying an intended signal at a frequency $f\_1$ with a local oscillator frequency $f\_lo$ ($f\_lo > f\_1$) to provide an IF frequency at $f\_lo - f\_1$ will also convert down any image signal arising at the other side of the local oscillator (LO) frequency (i.e., at $f\_2 = 2 \times f\_lo - f\_1$) down to the same IF frequency $f\_lo - f\_1$. Therefore, rigid requirements are placed on image rejection since adjacent, in-band signals can be much stronger than the intended signal (note that in the heterodyne-type receiver the image band falls outside the communication band and is therefore suppressed by an RF filter which is present after the antenna and before the signal enters the receiver).

In addition to the push for on-chip integration, work is going on to increase the data rates in existing mobile systems. There are several possible techniques for obtaining higher data rates including multi carrier schemes. In a multi-carrier system, a communication link is assigned several carriers each supporting one channel. Thus, several low-rate channels are combined to form one high-rate link. However, multi-carrier systems tend to complicate transceiver design, and in general are not attractive if a single chip solution is desired.

Thus, there is a need for a radio architecture that can easily be implemented on chip, but which will also fulfill selectivity and image rejection requirements. There is also a need for an on-chip radio architecture that provides an increased data rate compared to current transceiver implementations.

SUMMARY

The present invention fulfills the above described and other needs by providing a multi-carrier, low-IF radio architecture in which two carriers are images of each other. Advantageously, the present invention teaches that if there are certain restrictions placed on the location of multiple carriers in the frequency domain, a radio architecture can be built which is very suitable for on-chip integration. Indeed, the present invention teaches that a dual-carrier radio transceiver can be more suitable for integration on a single chip than is a single-carrier transceiver.

In the low-IF architecture of the present invention, an in-phase and quadrature signal are created in an I branch and a Q branch, respectively. By rotating the Q signal by ninety degrees, and subsequently adding the I and rotated Q signals, the lower bands (i.e., the bands lower in frequency than a local oscillator frequency) are suppressed and the upper bands remain. However, if instead the rotated Q signal is subtracted from the I signal, the upper bands are suppressed and the lower bands remain. Thus, by using a proper local oscillator frequency, simultaneously the upper RF band and the lower RF band can be retrieved using a low-IF, dual-output quadrature mixer such as that taught by the present invention. Additionally, after the upper and lower bands are retrieved, the former procedure can be repeated on the outputs of the first low-IF, dual-output quadrature mixer using a new, appropriate local oscillator frequency. Provided the bands are again images of one another, two new bands result. This process can be repeated until the final bands are the individual carriers desired.

Advantageously, since a low-IF architecture is used in the dual-output quadrature mixer, this mixer can be integrated on chip using low-Q filters. In the dual-output quadrature mixer, only low-pass filters are required to suppress the second harmonics. Thus, the actual channel filtering can be postponed until baseband, and the DC problems encountered in the homodyne receiver are not present. In addition, since the carriers are part of the same link (i.e., transmitted by the same transmitter), image rejection problems are reduced as the signal strengths only differ due to multi-path fading. In-band blocking problems regarding the image do not exist.

The present invention also teaches that by interleaving information bits over the channels, frequency diversity is obtained and system capacity is increased. In other words, by spreading information at different frequency bands, diversity is obtained which can in general be translated into an increase in system capacity. In addition, a single wideband signal can be divided into several small-band signals each provided to a different (sub)carrier. This is similar to Orthogonal Frequency Division Multiplexing (OFDM). However, according to the present invention, the subchannels do not have to be adjacent. Therefore, larger frequency diversity can be obtained by spacing the subchannels widely apart. As with OFDM, dispersion effects are reduced due to the longer symbol times on the individual carriers. Synchronization difficulties, such as are encountered in the OFDM systems, are not present in the current invention.

Terminals applying the multi-carrier techniques of the present invention are completely compatible with existing networks. An existing network need only assign a number of channels on different carriers in a structured manner and then consider the channels as part of the same link. Advantageously, the present invention requires no more extra baseband processing than other proposed high-rate schemes (e.g., multi-slot operation in TDMA systems).

In an exemplary embodiment, a dual-output quadrature mixer includes a first mixer for mixing an input signal with a local oscillator signal to produce an in-phase downconverted signal. The exemplary dual-output mixer also includes a first phase shifter for phase-shifting, or rotating, the local oscillator signal to produce a quadrature local oscillator signal, and a second mixer for mixing the input signal with the quadrature local oscillator signal to produce a quadrature downconverted signal. A second phase shifter rotates the quadrature downconverted signal to produce a rotated quadrature downconverted signal. Additionally, a summer sums the in-phase downconverted signal and the rotated quadrature downconverted signal to produce an upper band detection output signal, and a subtractor subtracts the rotated quadrature downconverted signal from the in-phase downconverted signal to produce a lower band detection output signal. In the exemplary embodiment, a first filter is coupled to an output of the first mixer for filtering the in-phase downconverted signal to provide a filtered in-phase downconverted signal which is coupled to the summer and the subtractor. Additionally, a second filter is coupled to an output of the second mixer for filtering the quadrature downconverted signal to provide a filtered quadrature downconverted signal which is coupled to said second phase shifter.

In another exemplary embodiment, a dual-input quadrature mixer includes a first phase shifter for shifting a first input signal to produce a first shifted input signal and a second phase shifter for shifting a second input signal to produce a second shifted input signal. Additionally, a first summer sums the first shifted input signal and the second input signal to produce a first hybrid signal, and a second summer sums the first input signal and the second shifted input signal to produce a second hybrid signal. A first mixer mixes the first hybrid signal with an in-phase local oscillator signal to produce a first upconverted signal. Also, a third phase shifter shifts the local oscillator signal to produce a quadrature local oscillator signal, and a second mixer mixes the second hybrid signal with the quadrature local oscillator signal to produce a second upconverted signal. Finally, a third summer sums the first and second upconverted signals to produce a multi-carrier output signal.

The above described and additional features of the present invention are explained in greater detail hereinafter with reference to the illustrative examples which are shown in the accompanying drawings. Those skilled in the art will appreciate that the described embodiments are provided for purposes of illustration and understanding and that numerous equivalent embodiments are contemplated herein.

DETAILED DESCRIPTION

As described above, the general trend in radio transceiver design for portable communication devices is to integrate as many functions as possible on a single chip. This trend driven in part by the reduction in price per transistor and per square millimeter of silicon in current VLSI circuits. Integrating as much as possible on a single chip also reduces the amount of pins on the package and thus reduces power consumption and printed circuit board area.

Radio design at the higher RF frequencies in the range of 1–2 GHz has traditionally been based on many discrete components. One of the main obstacles with respect to achieving full integration relates to the filters used. Specifically, building filters of sufficient selectivity (i.e., high quality- or high Q-value) on chip has proven difficult in the context of conventional radio architectures.

Figure 1:
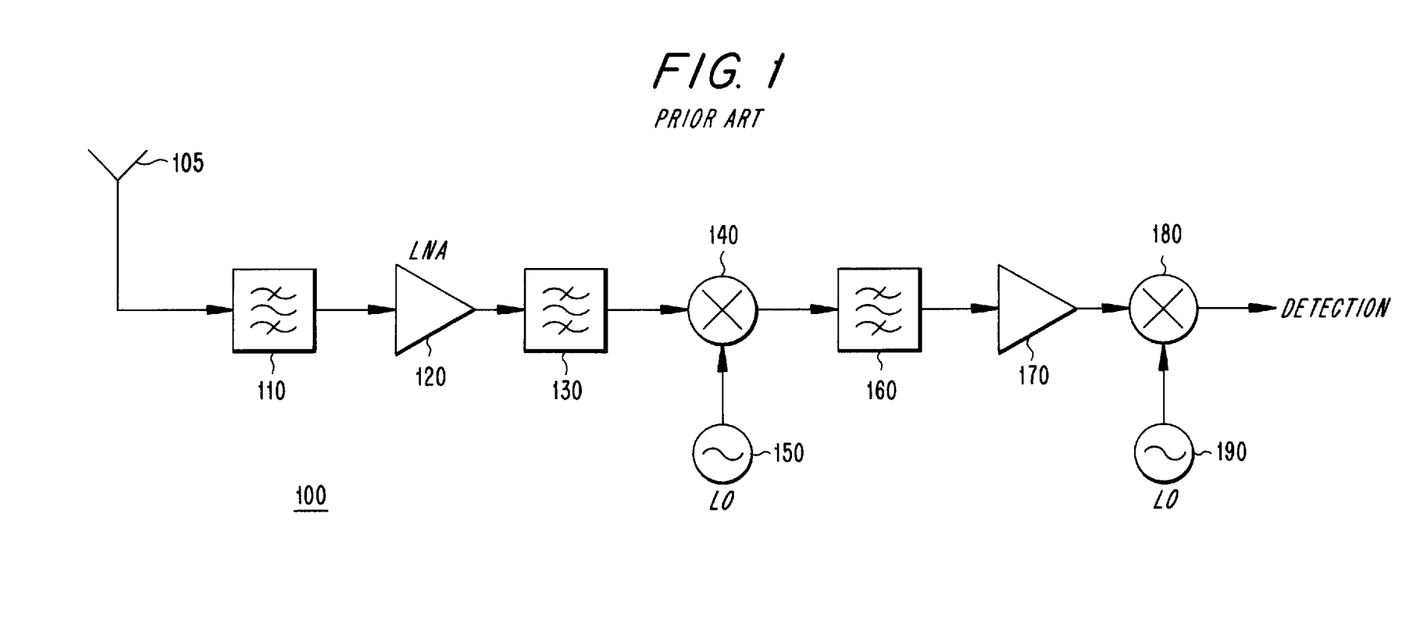
FIG. 1 is a block diagram of a conventional, two-stage superheterodyne receiver.

Consider, for example, the superheterodyne approach employed in many conventional radio systems. FIG. 1 depicts a conventional superheterodyne receiver 100. As shown, the receiver 100 includes an antenna 105, a first filter 110, a first (low-noise) amplifier 120, a second filter 130, a first mixer 140, a first local oscillator 150, a third filter 160, a second amplifier 170, a second mixer 180 and a second local oscillator 190.

In FIG. 1, an output of the antenna 105 is coupled to an input of the first filter 110. An output of the first filter 110 is coupled to an input of the first amplifier 120 and an output of the first amplifier 120 is coupled to an input of the second filter 130. An output of the second filter 130 and an output of the local oscillator are coupled to inputs of the mixer 140. An output of the mixer 140 is coupled to an input of the third filter 160 and an output of the third filter 160 is coupled to an input of the second amplifier 170. An output of the second amplifier 170 and an output of the second local oscillator 190 are coupled to inputs of the second mixer 180. An output of the mixer 180 serves as an output of the receiver 100. In operation, the RF signal input is down-converted to an appropriate IF frequency where it is filtered, usually applying off-chip ceramic bandpass filters or SAW bandpass filters which are hard to integrate on silicon with conventional IC technology.

Figure 2:
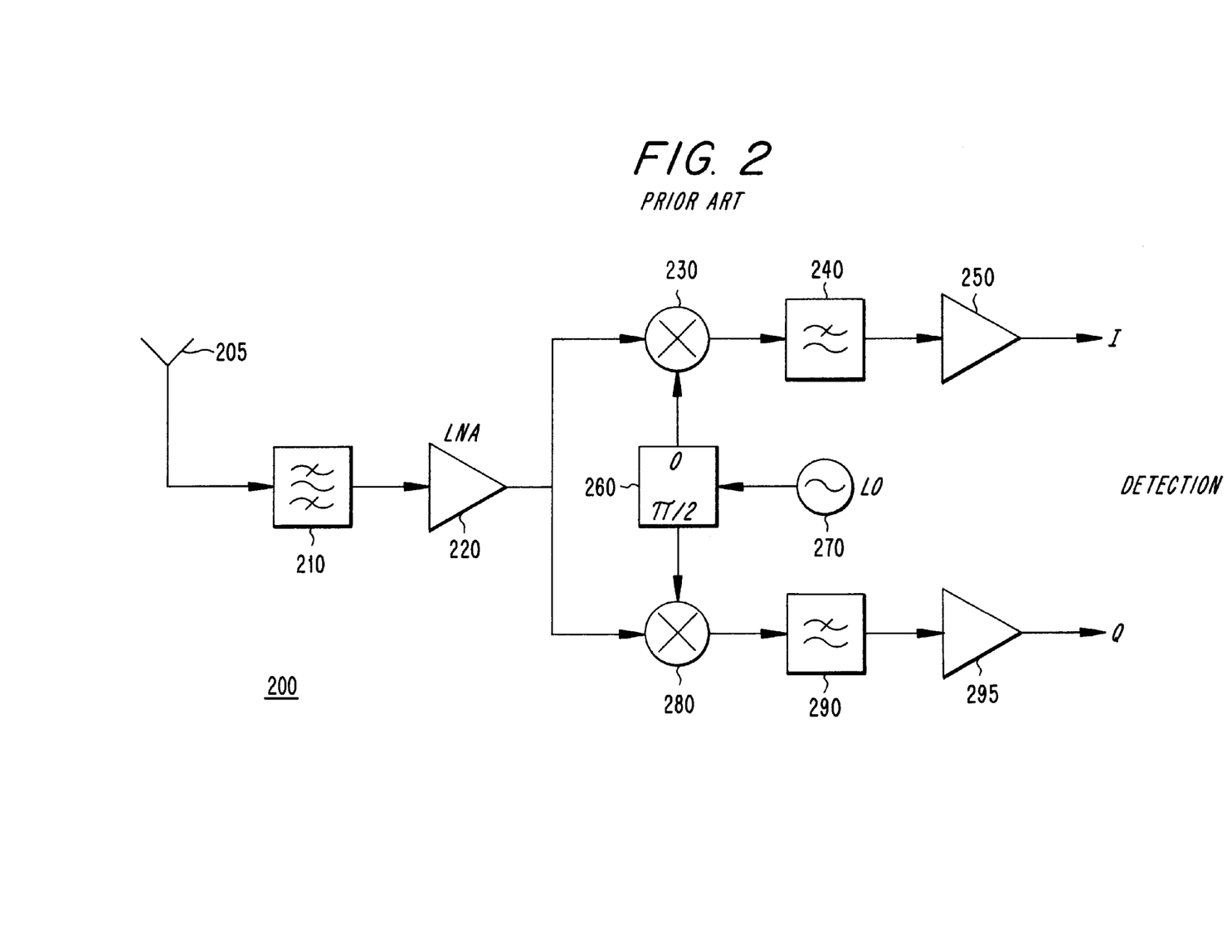
FIG. 2 is a block diagram of a conventional homodyne receiver.

A step towards full integration is the application of a homodyne architecture. FIG. 2 depicts a conventional homodyne receiver 200. As shown, the receiver 200 comprises an antenna 205, a first filter 210, a first (low-noise) amplifier 220, a first mixer 230, a second filter 240, a second amplifier 250, a phase shifter 260, a local oscillator 270, a second mixer 280, a third filter 290 and a third amplifier 295.

In FIG. 2, an output of the antenna 205 is coupled to an input of the first filter 210 and an output of the first filter 210 is coupled to an input of the first amplifier 220. An output of the first amplifier 220 is coupled to an input of the first mixer 230 and to an input of the second mixer 280. Additionally, an output of the first mixer 230 is coupled to an input of the second filter 240 and an output of the second filter 240 is coupled to an input of the second amplifier 250. An output of the second amplifier 250 serves as a first output I of the receiver 200.

Additionally, an output of the second mixer 280 is coupled to an input of the third filter 290 and an output of the third filter 290 is coupled to an input of the third amplifier 295. An output of the third amplifier 295 serves as a second output Q of the receiver 200. An output of the local oscillator 270 is coupled to an input of the phase shifter 260. A 0-degree output of the phase shifter 260 is coupled to an input of the first mixer 230 and a π/2 output of the phase shifter 260 is coupled to an input of the second mixer 280. In operation, the RF signal is down-converted directly to baseband or DC. The filtering function now involves low-pass filtering which is much easier to achieve on chip, especially with digital filtering at baseband. However, homodyne systems have problems as well. For example, DC offsets and second-order inter-modulation.

Figure 3:
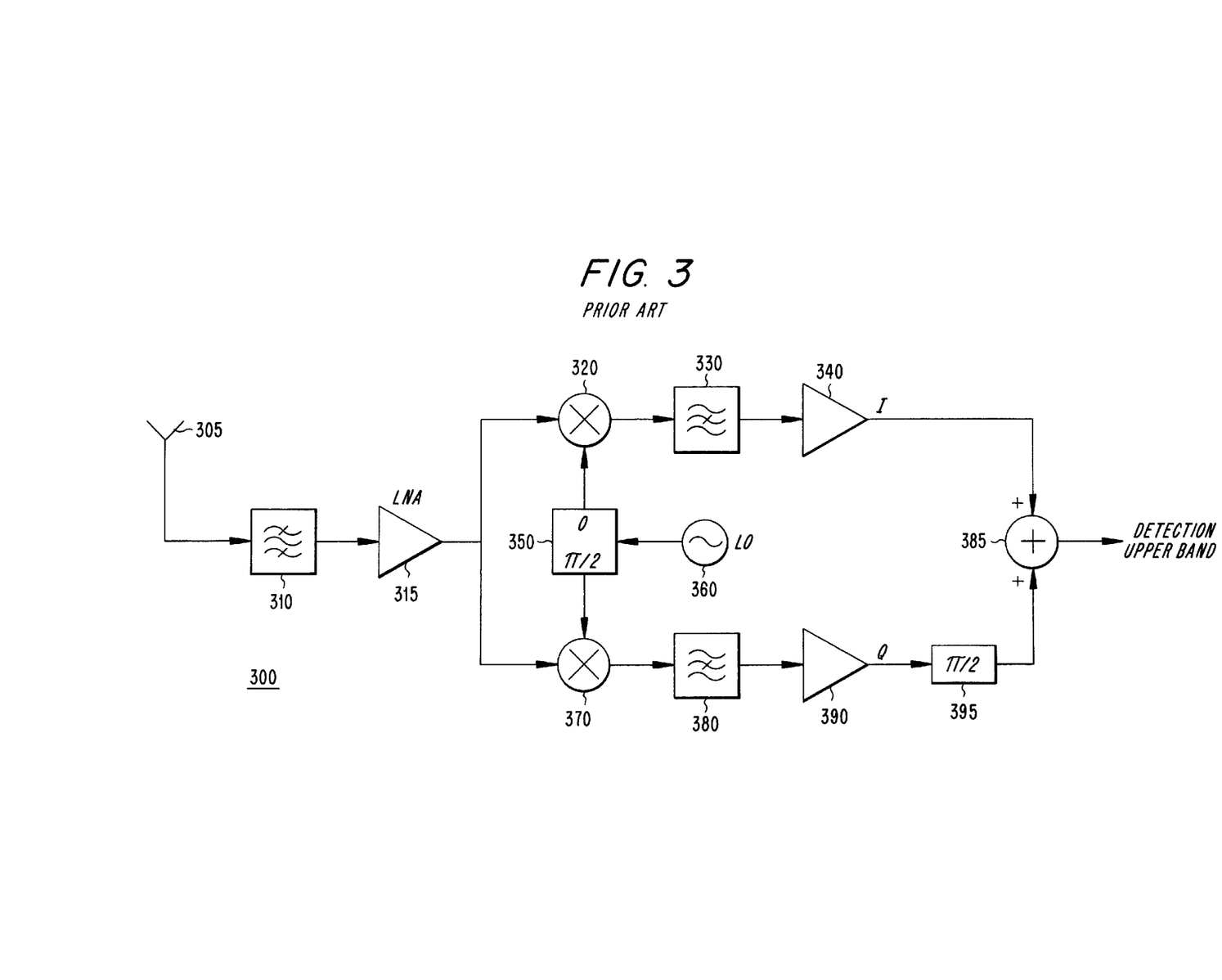
FIG. 3 is a block diagram of a conventional low-IF receiver.

Low-IF architectures try to combine the advantage of on-chip implementation while trying to avoid the problems encountered in homodyne receivers. FIG. 3 depicts a conventional low-IF receiver 300. As shown, the receiver 300 comprises an antenna 305, a first filter 310, a first (low-noise) amplifier 315, a first mixer 320, a second filter 330, a second amplifier 340, a phase shifter 350, a local oscillator 360, a summer 385, a second mixer 370, a third filter 380, a third amplifier 390 and a second phase shifter 395.

In FIG. 3, an output of the antenna 305 is coupled to an input of the first filter 310 and an output of the first filter 310 is coupled to an input of the first amplifier 315. An output of the first amplifier 315 is coupled to an input of the first mixer 320 and to an input of the second mixer 370. Additionally, an output of the first mixer 320 is coupled to an input of the second filter 330 and an output of the second filter 330 is coupled to an input of the second amplifier 340. An output of the second mixer 370 is coupled to an input of the third filter 380, and an output of the third filter 380 is coupled to an input of the third amplifier 390.

An output of the third amplifier 390 is coupled to an input of the second phase shifter 395 and an output of the second phase shifter 395 is coupled to an input of the summer 385. An output of the summer 385 serves as an output of the receiver 300. An output of the local oscillator 360 is coupled to an input of the first phase shifter 350. A 0-degree output of the phase shifter 350 is coupled to an input of the first mixer 320 and a π/2 output of the first phase shifter 350 is coupled to an input of the second mixer 370.

In operation, the first IF lies at a low intermediate frequency, such that sufficient selectivity can be obtained with on-chip (low-Q) filters. The filters are either bandpass filters or low-pass filters, depending on how low the IF lies. A consequence of the low-IF signal processing is that the local oscillator (LO) frequency is close to the desired carrier such that the difference frequency is the low intermediate frequency. As a result, the image signal at the other side of the local oscillator is usually in the RF communication band. High requirements on image rejection are set in order to suppress the impact of the image signal which can be much stronger than the intended carrier. This has always been a problem with respect to low-IF architectures in radio communication systems.

Advantageously, however, the present invention teaches that the image signal can be regarded as the other information bearer in a multi-carrier system. If the LO frequency is tuned at a frequency midway between the two carriers (assuming a dual-carrier system), the signals will be images for each other. Thus, with a low-IF architecture constructed in accordance with the present invention, both carriers can be retrieved without requiring such high-Q image-rejection filters. As a result, a much higher level of integration can be achieved.

Figure 4:
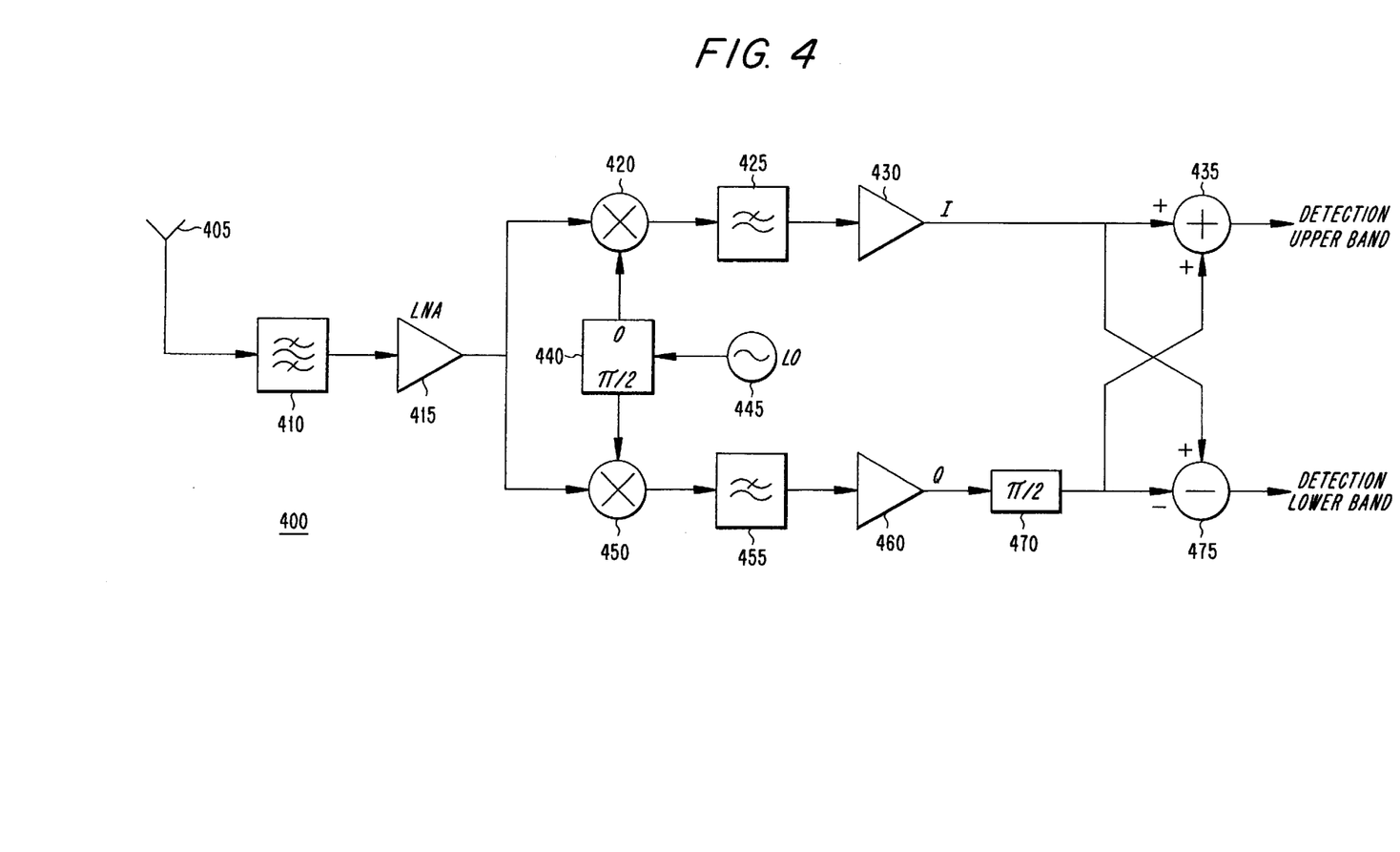
FIG. 4 is a block diagram of a low-IF, dual-output quadrature mixer for down-conversion constructed in accordance with the present invention.

FIG. 4 depicts a dual output quadrature mixer 400 constructed in accordance with the teachings of the present invention. As shown, the dual output quadrature mixer 400 comprises an antenna 405, a first filter 410, a first (low-noise) amplifier 415, a first mixer 420, a second filter 425, a second amplifier 430, a summer 435, a first phase shifter 440, a local oscillator 445, a second mixer 450, a third filter 455, a third amplifier 460, a second phase shifter 470 and a subtractor 475.

In FIG. 4, an output of the antenna 405 is coupled to an input of the first filter 410 and an output of the first filter 410 is coupled to an input of the first amplifier 415. An output of the first amplifier 415 is coupled to an input of the first mixer 420 and to an input of the second mixer 450. An output of the first mixer 420 is coupled to an input of the second filter 425 and an output of the second filter 425 is coupled to an input of the second amplifier 430. An output of the second amplifier 430 is coupled to an input of the summer 435 and to an input of the subtractor 475. An output of the second mixer 450 is coupled to an input of the third filter 455 and an output of the third filter 455 is coupled to an input of the third amplifier 460. An output of the third amplifier 460 is coupled to an input of the second phase shifter 470. An output of the phase shifter 470 is coupled to an input of the summer 435 and to an input of the subtractor 475. An output of the summer 435 serves as a first output of the quadrature mixer 400 and an output of the subtractor 475 serves as a second output of the quadrature mixer 400. An output of the local oscillator 445 is coupled to an input of the first phase shifter 440. A 0-degree output of the phase shifter 440 is coupled to an input of the first mixer 420 and a π/2 output of the first phase shifter 440 is coupled to an input of the second mixer 450.

In operation, this low-IF, dual-output quadrature mixer can be seen as a superposition of two conventional low-IF receivers, one in which the I and Q branches are added to each other, and one in which the I and Q branches are subtracted from each other. Since the two carriers belong to the same link, severe image problems as can be encountered in a conventional low-IF receiver do not occur. The signal strengths of the carriers only differ due to frequency selective fading (e.g., multipath or Rayleigh fading). The image rejection depends on the balance between the I and Q branches. Since the low-IF receiver can be implemented on chip, a good match between the branches can be obtained.

Typically, image suppression over a bandwidth of 1 MHz lies in the 30–40 dB range. For smaller bandwidths, even higher suppression values can be obtained. Suppression values up to 60 dB have been reported. See, for example, M. Steyaert and J. Crols, "Analog Integrated Polyphase Filters", Analog Circuit Design, R. J. van de Plassche, et al. (eds), Kluwer Academic Publishers, which is incorporated herein by reference. If a minimum C/I of say 10 dB is required, the carriers may differ by say 20–30 dB due to multipath fading.

Figure 5:
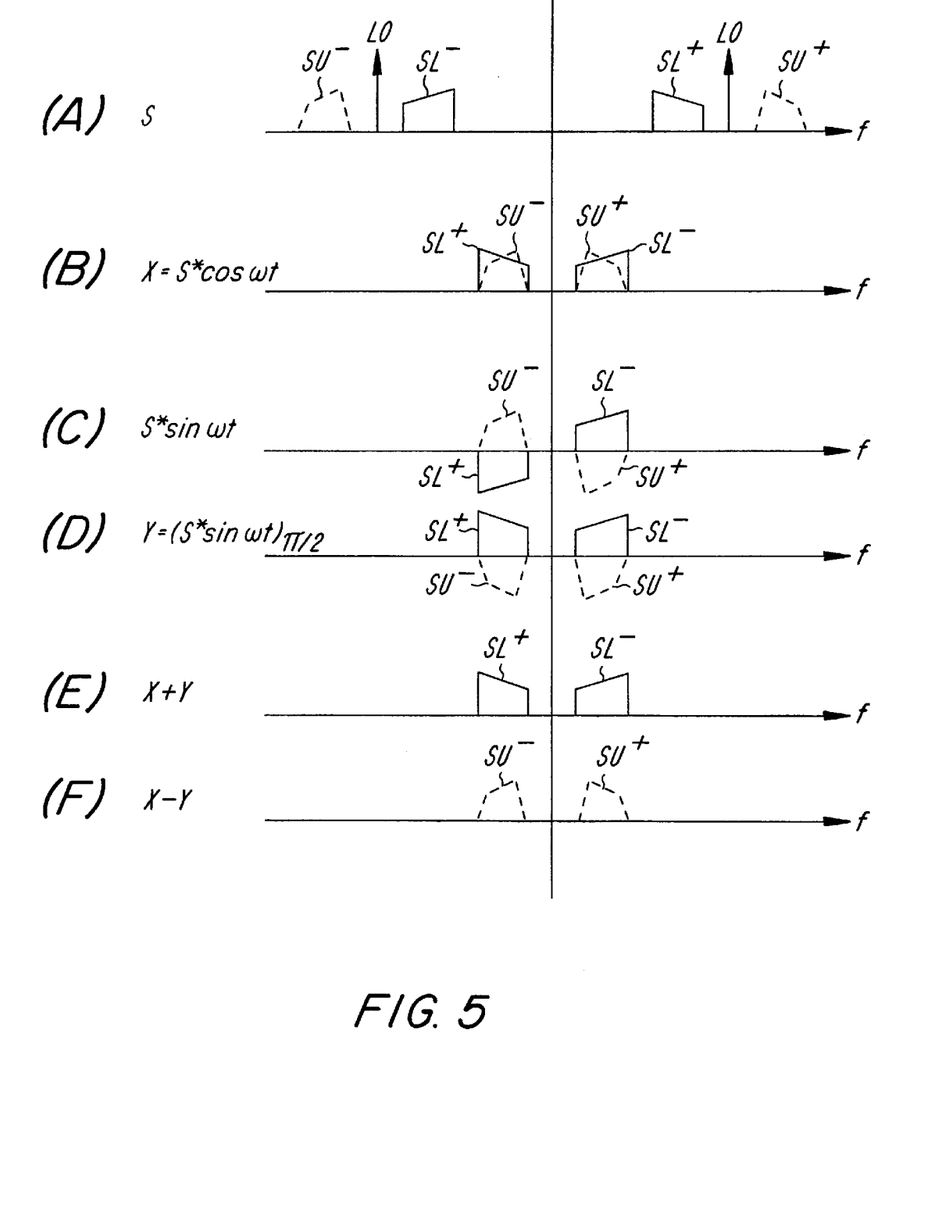
FIG. 5 is a frequency representation of a two-carrier system and low-IF reception as taught by the present invention.

An explanation in the frequency domain of the down-conversion and image suppression for a dual-carrier system is shown in FIG. 5. As shown, by multiplying the RF signal S with the in-phase and quadrature components of the local oscillator, the signal S is represented as a complex signal by an I and Q component. If either the I or Q component is then shifted by ninety degrees and the two components are then subsequently summed and subtracted, the signals below and above the local oscillator are retrieved separately, respectively. It should be taken into account that the lower band retrieved is mirrored. Therefore, for a correct reconstruction, the phase is inverted.

Advantageously, the idea behind the two-carrier embodiment of FIG. 4 can be extended to more than two carriers. Generally, as long as corresponding sets of carriers remain each others' images, a simple receiver architecture remains. For example, by cascading the quadrature mixers and in each case choosing the right LO frequency, information signals on each different carrier can be properly retrieved. In exemplary multi-carrier embodiments, only low-pass filters are used in the quadrature mixer in order to suppress the second harmonic that results due to the multiplication with the local oscillator.

Figure 6A:
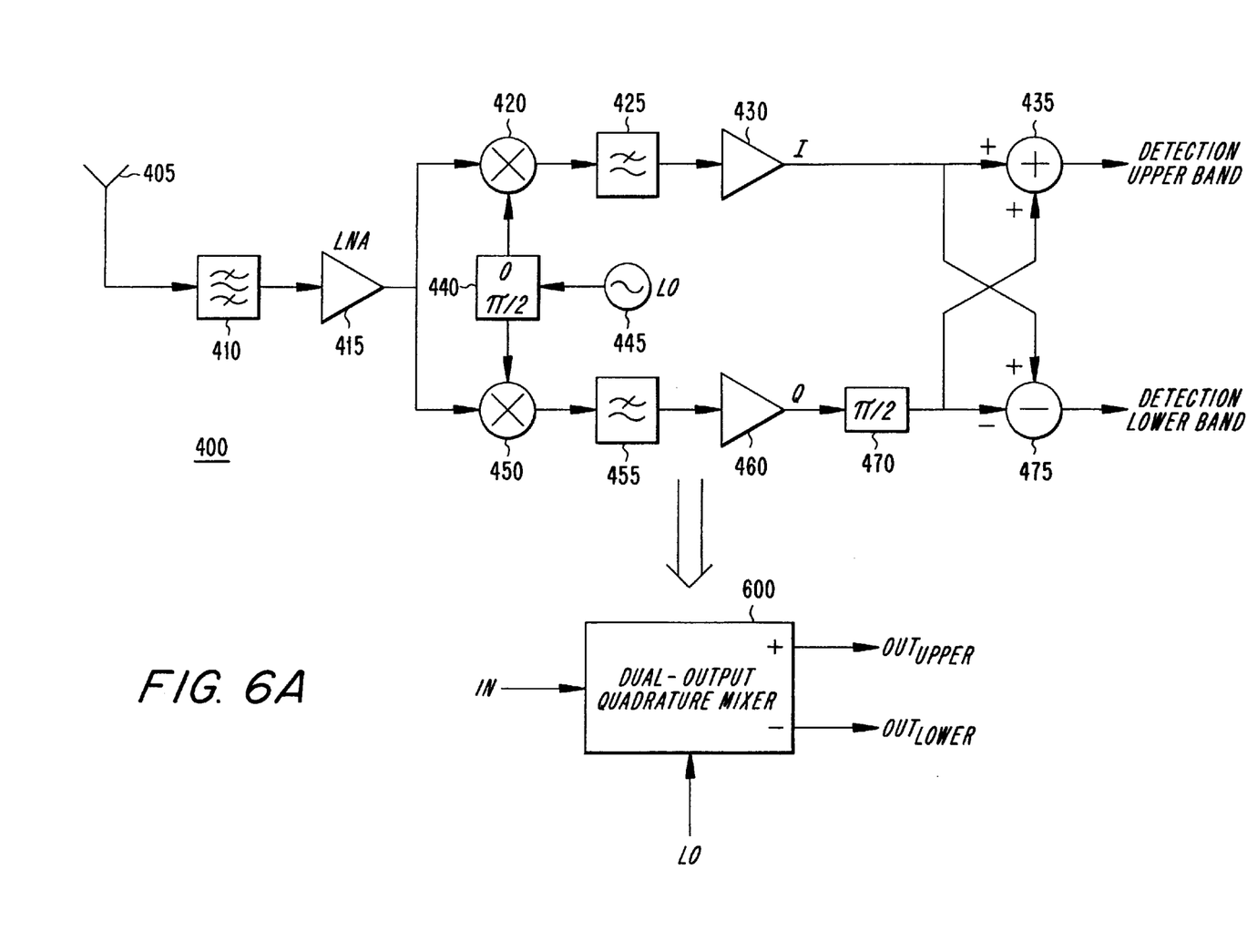
FIG. 6A is a block diagram of a dual-output quadrature mixer constructed in accordance with the teachings of the present invention.
Figure 6B:
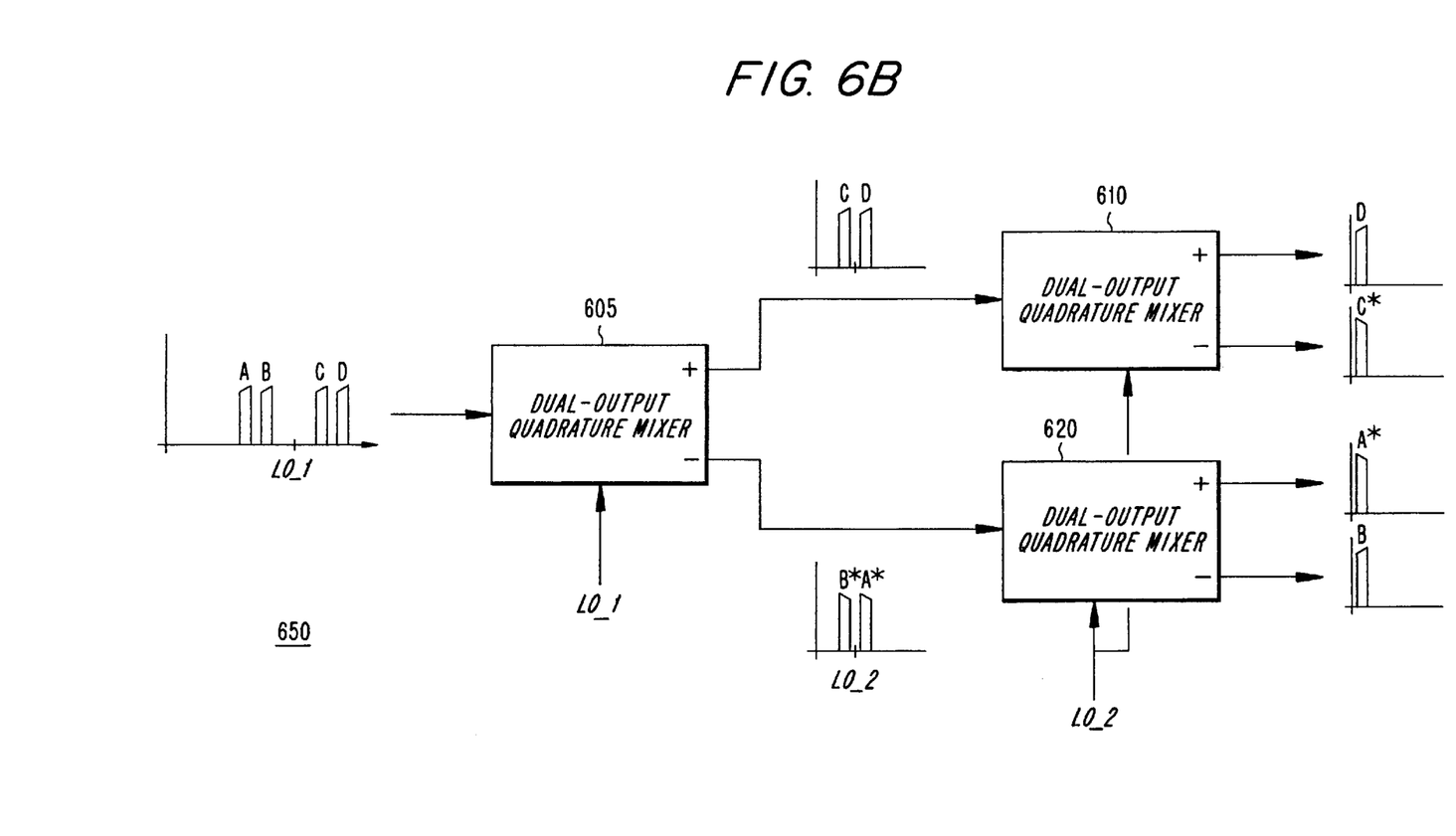
FIG. 6B is an example of cascaded dual-output quadrature mixers for de-multiplexing a four-carrier signal as is taught by the present invention.

For convenience, the dual-output quadrature mixer of FIG. 4 is shown as a single block 600 in FIG. 6A. FIG. 6B then illustrates the cascading concept for a four-carrier system (note that the frequency plots in FIG. 6B only show positive frequencies). As shown, a four-carrier mixer 650 comprises first, second and third quadrature mixers 605, 610, 620. An input of the first quadrature mixer 605 serves as an input for the four-carrier mixer 650. A positive output of the first quadrature mixer 605 is coupled to an input of the second quadrature mixer 610, and a negative output of the first quadrature mixer 605 is coupled to an input of the third quadrature mixer 620. A positive output of the second quadrature mixer 610 serves as a first output of the four-carrier mixer 650, and a negative output of the second quadrature mixer 610 serves as a second output of the four-carrier mixer 650. Finally, a positive output of the third quadrature mixer 620 serves as a third output of the four-carrier mixer 650, and a negative output of the third quadrature mixer 620 serves as a fourth output of the four carrier mixer 650.

In operation, the only requirement for the carriers is that they are spaced such that the carriers form images of one another in a two-by-two fashion. In FIG. 6B, this means that for the first stage, carriers A and D, and carriers B and C are each other's image. Therefore, the first local oscillator frequency LO-1 is chosen midway between the carriers. For the second stage, carriers C and D are each other's image in the upper circuit, whereas carriers A* and B* are each other's image in the lower circuit (where A* and B* indicate the complex conjugates of A and B, respectively).

In both cases, the second local oscillator frequency LO-2 lies midway between carriers A and B (or carriers C and D) considered after the first down-conversion. At the end of the circuit, the individual components of multi-carrier input are produced. At this point, the actual channel filtering can be performed. Note that although in FIG. 6B the circuits as represented in FIG. 6A include analog filters and mixers, part of the mixer can be implemented digitally. In particular, the channel filtering at the end of the downconversion can be done in a digital signal processor.

It will be understood by those skilled in the art that the scheme of FIG. 6B can be extended to more than four carriers. In general, the number of carriers should be $2^N$ where N is an integer. The carrier spacing does not have to be fixed. However, the spacing should be set such that, for each mixer stage, a LO frequency can be chosen such that the carriers are each others' image. Advantageously, an entire multi-carrier receiver including a plurality of cascaded units 600 can be integrated together on a single chip.

To this point, exemplary receiver architectures of a multi-carrier transceiver have been described. Generally, by employing low-IF dual-output quadrature mixers, a multi-carrier signal is conveniently separated into its individual subcarriers. In the discussion that follows, corresponding exemplary transmit architectures are described. For example, in certain contexts an appropriate multiband signal can be generated directly at baseband in the digital domain, and then upconverted to the RF band. However, if the bandwidths become larger, generation in the digital domain can be difficult. Therefore, the present invention teaches methods and apparatus which can be implemented in the analog domain and which can be regarded to be the complement of the multi-carrier receiver embodiments described above.

Figure 7:
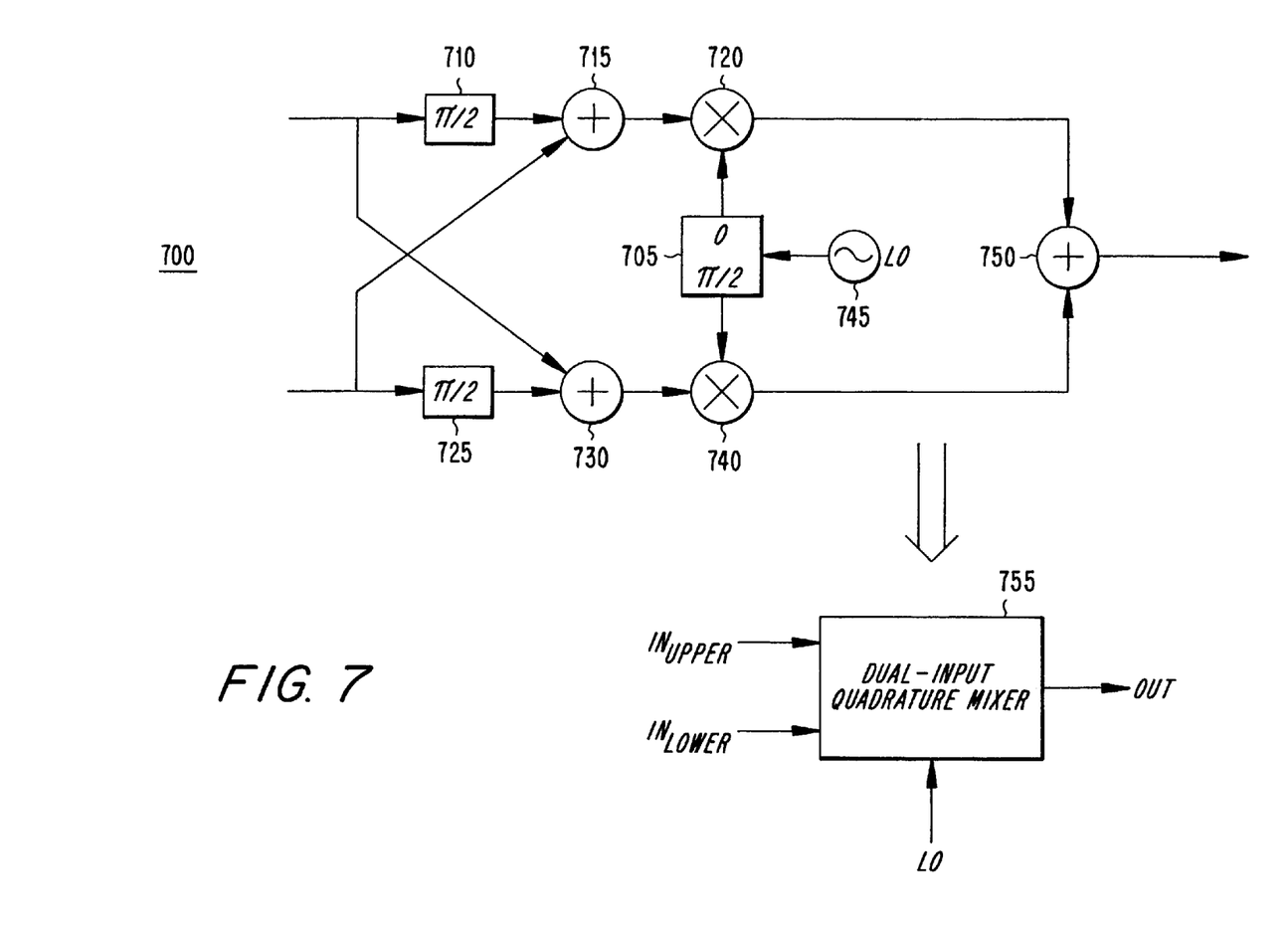
FIG. 7 is a block diagram of a dual-input quadrature mixer for up-conversion constructed in accordance with the present invention.

FIG. 7 depicts a compatible multi-carrier transmitter constructed in accordance with the teachings of the present invention. As shown, a dual input quadrature mixer 700 comprises a first phase shifter 710, a first summer 715, a first mixer 720, a second phase shifter 725, a second summer 730, a second mixer 740, a third phase shifter 705, a local oscillator 745 and a third summer 750. A first input of the dual input quadrature mixer 700 is coupled to an input of the first phase shifter 710 and to an input of the second summer 730. A second input of the dual input quadrature mixer 700 is coupled to an input of the first summer 715 and to an input of the second phase shifter 725. An output of the first phase shifter 710 is coupled to an input of the first summer 715, and an output of the first summer 715 is coupled to an input of the first mixer 720.

An output of the second phase shifter 725 is coupled to an input of the second summer 730 and an output of the second summer 730 is coupled to an input of the second mixer 740. An output of the local oscillator is coupled to an input of the third phase shifter 705, a 0-degree output of the third phase shifter 705 is coupled to an input of the first mixer 720, and a $\pi/2$ output of the third phase shifter 705 is coupled to an input of the second mixer 740. An output of the first mixer 720 is coupled to a first input of the third summer 750, and an output of the second mixer 740 is coupled to a second input of the summer 750. An output of the third summer 750 serves as an output of the dual input quadrature mixer 700.

The exemplary transmitter of FIG. 7 is based on the same principles as the low-IF dual-output mixer used at the receiver. In operation, the input signals are phase shifted by ninety degrees and subsequently multiplied in a quadrature mixer. The outputs of the mixer are then summed such that the input signal at the upper input falls above the LO frequency and the input signal at the lower input falls below the LO frequency.

By analogy to the cascading of dual-output quadrature mixers in the receiver, a cascade of dual-input quadrature mixers can be applied in the transmitter. Thus, for convenience, the dual-input quadrature mixer 700 is shown as a single block 755 in FIG. 7, and FIG. 8 depicts an exemplary four-carrier transmitter employing three cascaded dual-input mixers (note that the frequency plots in FIG. 8 only show positive frequencies).

Figure 8:
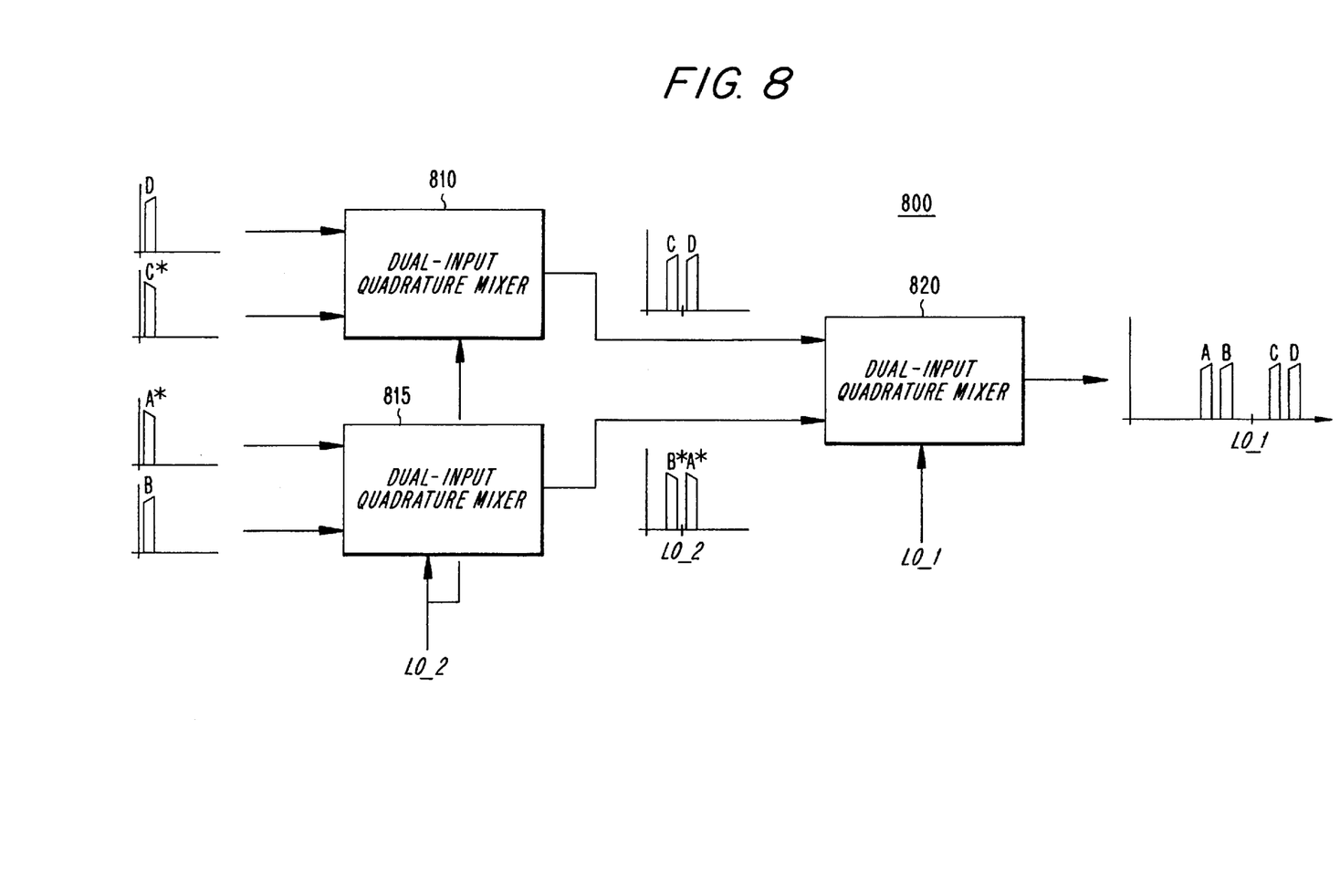
FIG. 8 is an example of cascaded dual-input quadrature mixers for multiplexing a four-carrier signal as is taught by the present invention.

As shown in FIG. 8, a four-carrier quadrature mixer 800 comprises first, second and third dual input quadrature mixers 810, 815, 820. A first input of the first quadrature mixer 810 serves as a first input for the four carrier mixer 800 and a second input of the first quadrature mixer 810 serves as a second input of the four carrier mixer 800. Additionally, a first input of the second quadrature mixer 815 serves as a third input for the four carrier mixer 800 and a second input of the second quadrature mixer 815 serves as a fourth input for the four carrier mixer 800.

An output of the first quadrature mixer 810 is coupled to a first input of the third quadrature mixer 820 and an output of the second quadrature mixer 815 is coupled to a second input of the third quadrature mixer 820. An output of the third quadrature mixer 820 serves as an output for the four carrier mixer 800. Local oscillators are coupled to inputs of each of the first, second and third quadrature mixers 810, 815, 820.

In operation, the input signals are either complex baseband, or are located at a low intermediate frequency. The up-conversion stages in the transmitter use the same LO frequencies as the down-conversion stages in the receiver. The frequencies LO_1 and LO_2 in FIG. 8 therefore correspond to the frequencies LO_1 and LO_2 in FIG. 6B. As before, it will be understood by those skilled in the art that the described technique can be extended to more than four carriers. Also, it will be appreciated that an entire multi-carrier transmitter including a plurality of cascaded units 755 can be integrated together on a single chip.

Note that after up-conversion, a power amplifier (PA) is usually required before the signal is transmitted by the antenna. Therefore, since the multi-carrier system does not provide a constant envelope signal, it is important that the PA be linear. The amount of acceptable non-linearity will in particular be set by the requirements of out-of-band emission.

The multi-carrier systems of the present invention can be used in several ways. Firstly, they can be used to increase the data rate in existing mobile systems such as GSM or D-AMPS. Advantageously, the systems of the present invention are compatible with current implementations, meaning that minimal changes are required in existing networks and that conventional (single-carrier) terminals can still be used. A network has only to assign two (or a multiple) of carriers to a multi-carrier terminal, and then regard the carriers as part of the same connection. Due to blocking requirements, it is not possible to allocate fewer carriers to the multi-carrier terminal as it is designed. So for example, a dual-carrier terminal must always be allocated two carriers, even if the normal (standard) data rate is desired. However, by using a half-rate on both carriers, the standard rate can be achieved without reducing the system capacity.

In fact, system capacity increases due to frequency diversity. If the carrier spacing is larger than the coherence bandwidth, the multipath fading on the carriers can be regarded as independent. By interleaving the information over the various carriers, frequency diversity gain is obtained. Furthermore, by staggering the symbols over Tb/M where Tb is the symbol time and M the number of carriers, circuitry can be shared by multiplexing the different outputs of the receiver provided an appropriate oversampling rate is applied.

Another application of the present invention relates to Orthogonal Frequency Division Multiplexing (OFDM). In OFDM, a broadband channel is divided into a multiple of subchannels. A bit stream is multiplexed over the subchannels such that each subchannel carries a single symbol with a long symbol time. OFMD makes use of Fast Fourier Transform (FFT) techniques to multiplex the time information over frequency bands. Because of the frequency spreading, OFDM offers frequency diversity. Since the symbol time per subchannel is long, InterSymbol Interference (ISI) can be prevented and high-rate data transmission over dispersive (multipath) propagation paths becomes possible. However, the disadvantages with OFDM are that the subbands must be consecutive, and that strict synchronization is required since the FFTs are applied on fixed-length frames. The first disadvantage involves that frequency diversity is only obtained in OFDM systems with reasonable bandwidth: the fading between adjacent subbands is highly correlated. The second disadvantage involves the requirement for a synchronous connection.

Advantageously, however, the multi-carrier system of the present invention does not suffer from these disadvantages. According to the present invention, the subcarriers can be placed wide apart in order to obtain true frequency diversity. In addition, each carrier supports a channel which is independent of the other carrier(s) which means that synchronization problems like those in OFDM do not occur. Within certain limits, the location of carriers can be chosen freely. However, in order to simplify implementation, a constant spacing between the carriers could be used since in that case the LO frequencies used at IF are reduced by a factor of two for each additional stage. As in OFDM, a broadband channel can be split into a multiple of subchannels, and all of the benefits of OFDM can be had while avoiding for example ISI. Advantageously, in the present invention, a much stronger frequency diversity is obtained since the carriers can be spaced far apart.

Figure 9:
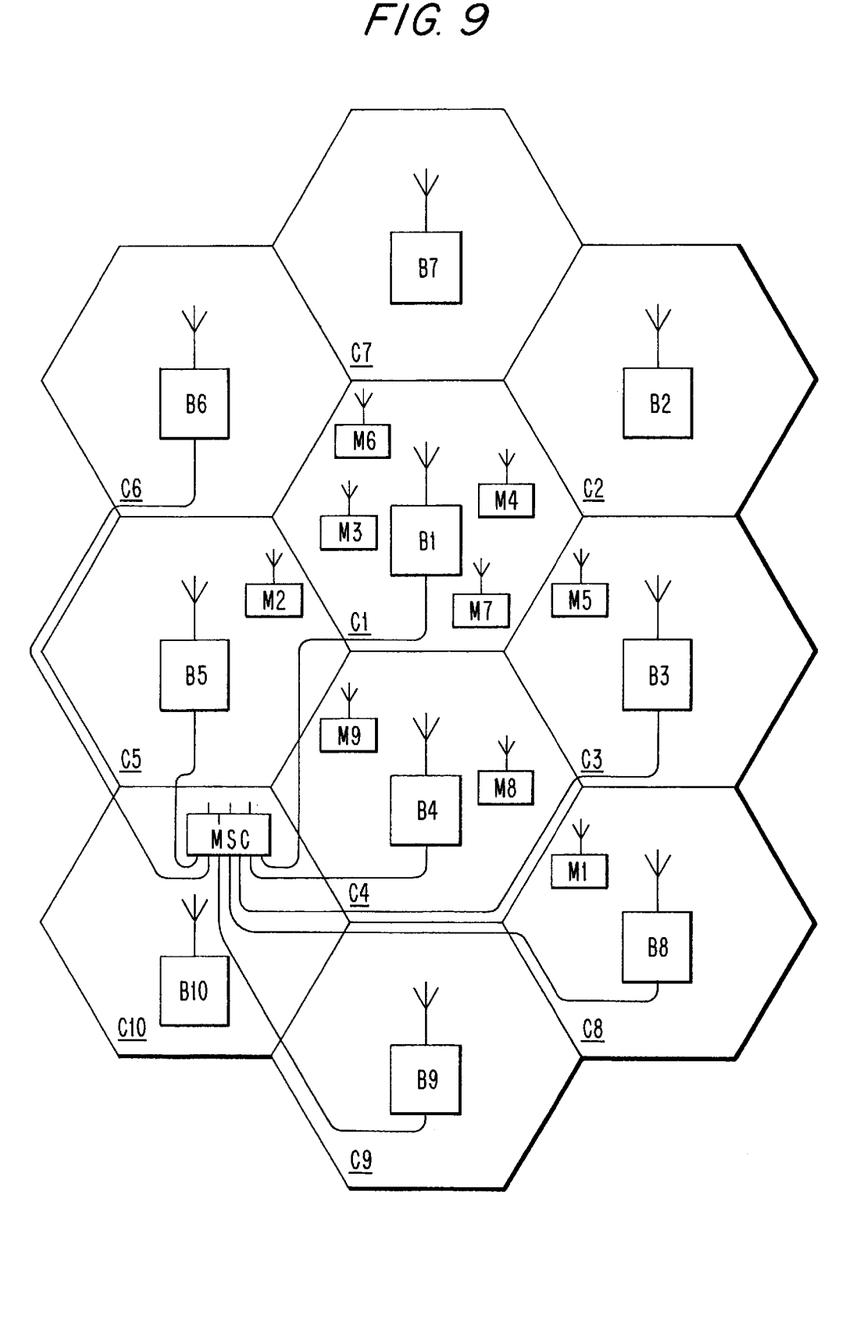
FIG. 9 depicts a multi-cell communications system in which the teachings of the present invention may be applied.

As the present invention can be implemented in a cellular mobile radiotelephone system, FIG. 9 depicts an exemplary system. As shown, there is a base station B1–B10 associated with each of ten cells C1–C10. Additionally, there are nine mobile stations M1–M9 which are movable within a cell and from one cell to another. In practice, a cellular mobile radio system would be implemented using more than ten cells and would include far more than nine mobile stations. However, the simplified representation of FIG. 9 is sufficient for purposes of understanding the teachings of the present invention.

Also shown in FIG. 9 is a mobile switching center MSC connected to the ten base stations B1–B10 by cabling or fixed radio links. Note that not all cabling from the mobile switching center MSC to the base stations B1–B10 is shown. The mobile switching center MSC is also connected by cabling or fixed radio link (not shown) to a fixed switching telephone network or other similar fixed network. The mobile switching center MSC, the base stations B1–B10, and the mobile stations M1–M9 are all computer controlled.

Figure 10:
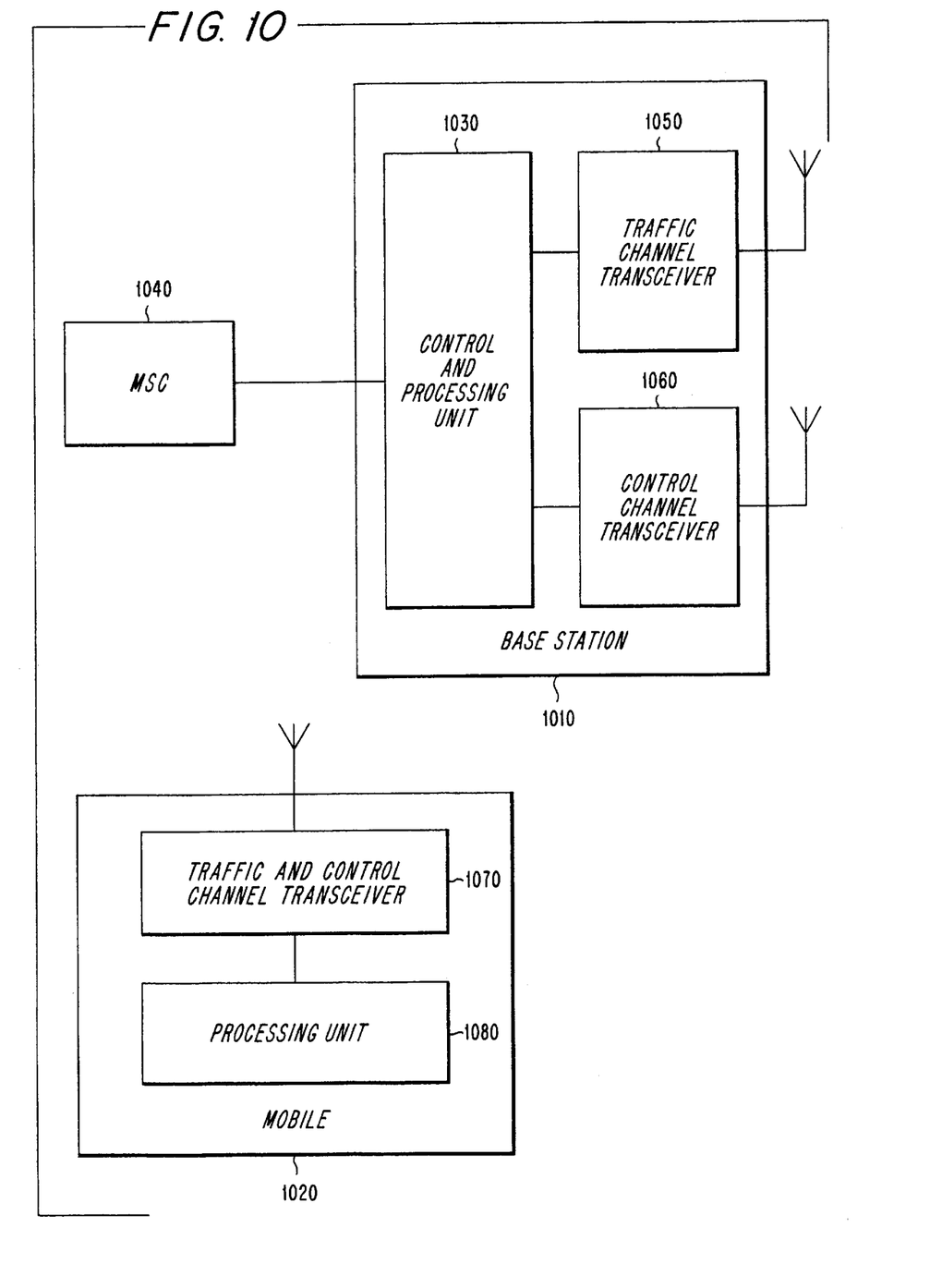
FIG. 10 depicts a base station and a mobile station in which the teachings of the present invention may be applied.

FIG. 10 depicts components in the exemplary cellular mobile radiotelephone system of FIG. 9. The figure shows an exemplary base station 1010 and an exemplary mobile station 1020. The base station 1010 includes a control and processing unit 1030 which is connected to a mobile switching center (MSC) 1040 which in turn is connected to the public switched telephone network (not shown). The base station 1010 also includes a traffic channel transceiver 1050 and a control channel transceiver 1060. The mobile 1020 includes a traffic and control channel transceiver 1070 and a processing unit 1080. The base station transceivers 1050, 1060 and the mobile transceiver 1070 can be constructed in accordance with the teachings of the present invention.

In operation, the base station 1010 for a cell includes a plurality of traffic channels handled by traffic channel transceiver 1050 which is controlled by the control and processing unit 1030. The control channel transceiver 1060 is also controlled by the control and processing unit 1030 and may be capable of handling more than one control channel. The control channel transceiver 1060 broadcasts control information over the control channel of the base station or cell to mobiles locked to that control channel. The traffic channel transceiver 1050 broadcasts the traffic channels which can include digital control channel location information.

The mobile 1020 periodically scans the control channels of base stations like base station 1010 to determine which cell to lock on or camp to. The mobile 1020 receives absolute and relative information broadcast on a control channel at its traffic and control channel transceiver 1070. Then, the processing unit 1080 evaluates the received control channel information which includes characteristics of the candidate cells and determines which cell the mobile should lock to. The received control channel information not only includes absolute information concerning the cell with which it is associated, but also contains relative information concerning other cells proximate to the cell with which the control channel is associated. These adjacent cells are periodically scanned by the mobile 1020 while it is monitoring the primary control channel to determine if there is a more suitable candidate.

Those skilled in the art will appreciate that the present invention is not limited to the specific exemplary embodiments which have been described herein for purposes of illustration. For example, although the exemplary embodiments have been described with reference to the rotation of a quadrature signal component, those skilled in the art will recognize that analogous results may be obtained by instead rotating the corresponding in-phase signal component. The scope of the invention, therefore, is defined by the claims which are appended hereto, rather than the foregoing description, and all equivalents which are consistent with the meaning of the claims are intended to be embraced therein.

I claim:

1. A radio transmitter, comprising:
   means for receiving first and second input signals;
   means for phase-shifting the first and second input signals to produce first and second phase-shifted input signals, respectively;
   means for summing the first input signal with the second phase-shifted input signal to produce a first hybrid signal;
   means for summing the first phase-shifted input signal with the second input signal to produce a second hybrid signal;
   means for mixing the first hybrid signal with an in-phase local oscillator signal to produce an in-phase upconverted signal;
   means for mixing the second hybrid signal with a quadrature local oscillator signal to produce a quadrature upconverted signal; and
   means for summing the in-phase upconverted signal and the quadrature upconverted signal to produce a multi-carrier output signal.

2. The radio transmitter of claim 1, wherein said first and second input signals are phase-shifted by ninety degrees to produce said first and second phase-shifted input signals.

3. The radio transmitter of claim 1, wherein said receiving means, said phase-shifting means, each of said summing means, and each of said mixing means are integrated on a single chip.

4. A dual-input quadrature mixer, comprising:
   a first phase shifter phase-shifting a first input signal to produce a first phase-shifted input signal;
   a second phase shifter phase-shifting a second input signal to produce a second phase-shifted input signal;
   a first summer summing the first phase-shifted input signal and the second input signal to produce a first hybrid signal;
   a second summer summing the first input signal and the second phase-shifted input signal to produce a second hybrid signal;
   a first mixer mixing the first hybrid signal with an in-phase local oscillator signal to produce a first upconverted signal;
   a third phase shifter phase-shifting the local oscillator signal to produce a quadrature local oscillator signal;
   a second mixer mixing the second hybrid signal with the quadrature local oscillator signal to produce a second upconverted signal; and
   a third summer summing the first and second upconverted signals to produce a multi-carrier output signal.

5. The radio transmitter of claim 4, wherein said first and second input signals are phase-shifted by ninety degrees to produce said first and second phase-shifted input signals.

6. The dual-input quadrature mixer of claim 4, wherein said first, second and third shifters, said first, second and third summers, and said first and second mixers form a single integrated circuit.

7. A method for upconverting radio information signals, comprising the steps of:
   receiving first and second input signals;
   phase-shifting the first and second input signals to produce first and second phase-shifted input signals, respectively;
   summing the first input signal with the second phase-shifted input signal to produce a first hybrid signal;
   summing the first phase-shifted input signal with the second input signal to produce a second hybrid signal;
   mixing the first hybrid signal with an in-phase local oscillator signal to produce an in-phase upconverted signal;
   mixing the second hybrid signal with a quadrature local oscillator signal to produce a quadrature upconverted signal; and
   summing the in-phase upconverted signal and the quadrature upconverted signal to produce a multi-carrier output signal.

8. An integrated multi-carrier transceiver, comprising:
   a receiver including a) means for mixing a receiver input signal with an in-phase local oscillator signal to provide an in-phase downconverted signal, b) means for mixing said receiver input signal with a quadrature local oscillator signal to provide a quadrature downconverted signal, c) means for phase-shifting one of said in-phase and quadrature downconverted signals to provide a phase-shifted downconverted signal, d) means for summing said phase-shifted downconverted signal with the one of said in-phase and quadrature downconverted signals which is not phase-shifted by said phase-shifting means to provide a first receiver output signal corresponding to a first band of said receiver input signal, and e) means for subtracting said phase-shifted downconverted signal from the one of said in-phase and quadrature downconverted signals which is not phase-shifted by said phase-shifting means to provide a second receiver output signal corresponding to a second band of said receiver input signal; and a transmitter including f) means for phase-shifting first and second transmitter input signals to produce first and second phase-shifted input signals, respectively, g) means for summing the first transmitter input signal with the second phase-shifted input signal to produce a first hybrid signal, h) means for summing the first phase-shifted input signal with the second transmitter input signal to produce a second hybrid signal, i) means for mixing the first hybrid signal with an in-phase local oscillator signal to produce an in-phase upconverted signal, j) means for mixing the second hybrid signal with a quadrature local oscillator signal to produce a quadrature upconverted signal, and k) means for summing the in-phase upconverted signal and the quadrature upconverted signal to produce a multi-carrier transmitter output signal.

9. The multi-carrier transceiver of claim 8, wherein components of said receiver are integrated on a single chip and wherein components of said transmitter are integrated on a single chip.

* * * * *